(12) United States Patent
Jung et al.

(10) Patent No.: US 10,746,543 B2
(45) Date of Patent: Aug. 18, 2020

(54) APPARATUS FOR MEASURING DISTANCE USING TWO-STEP TRACKING BASED ON SPAD SENSOR AND METHOD THEREOF

(71) Applicant: INDUSTRY-ACADEMIC COOPERATION FOUNDATION, YONSEI UNIVERSITY, Seoul (KR)

(72) Inventors: Seong Ook Jung, Seoul (KR); Jung Hyun Park, Seoul (KR); Jong Ha Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 190 days.

(21) Appl. No.: 16/058,448

(22) Filed: Aug. 8, 2018

(65) Prior Publication Data
US 2019/0049243 A1    Feb. 14, 2019

(30) Foreign Application Priority Data

Aug. 9, 2017    (KR) .......................... 10-2017-0101161

(51) Int. Cl.
*G01C 3/08* (2006.01)
*H01L 31/02* (2006.01)
(Continued)

(52) U.S. Cl.
CPC ................ *G01C 3/08* (2013.01); *G01S 7/487* (2013.01); *G01S 7/4865* (2013.01); *H01L 31/02027* (2013.01)

(58) Field of Classification Search
None
See application file for complete search history.

(56) References Cited

U.S. PATENT DOCUMENTS

2014/0217264 A1* 8/2014 Shepard ............. G01N 21/6458
250/208.1
2018/0259645 A1* 9/2018 Shu ........................ G01S 7/4863
(Continued)

FOREIGN PATENT DOCUMENTS

JP    2013-20972 A    1/2013
JP    2014-081253 A    5/2014
(Continued)

OTHER PUBLICATIONS

Communication dated Jan. 4, 2019, issued by the Korean Patent Office in counterpart Korean Patent Application No. 10-2017-0101161.

*Primary Examiner* — Iman K Kholdebarin
(74) *Attorney, Agent, or Firm* — Sughrue Mion, PLLC

(57) ABSTRACT

Disclosed are an apparatus for measuring distance using two-step tracking and a method thereof. More particularly, the apparatus includes a bit generator configured to generate coarse bits for first tracking from sensing data to measure distance to a target and fine bits for second tracking, corresponding to the coarse bits, to measure precise distance to the target; a coarse bit processor configured to receive the coarse bits, address the received coarse bits in any one histogram bin, which corresponds to the received coarse bits, among a plurality of histogram bins, and output coarse bits, which correspond to any one histogram bin exceeding a preset threshold among the histogram bins, as reference coarse bits; and a fine bit processor configured to output fine bits corresponding to the reference coarse bits.

11 Claims, 6 Drawing Sheets

(51) Int. Cl.
  *G01S 7/487*   (2006.01)
  *G01S 7/4865*  (2020.01)

(56) References Cited

U.S. PATENT DOCUMENTS

| | | | |
|---|---|---|---|
| 2019/0056497 A1* | 2/2019 | Pacala | H01L 31/107 |
| 2019/0353760 A1* | 11/2019 | Hasegawa | G01S 17/89 |
| 2020/0018853 A1* | 1/2020 | Hata | G01S 7/4816 |
| 2020/0041621 A1* | 2/2020 | Ozaki | H01L 31/107 |

FOREIGN PATENT DOCUMENTS

| | | |
|---|---|---|
| JP | 2015-055821 A | 3/2015 |
| JP | 2015-169501 A | 9/2015 |
| KR | 10-1293057 B1 | 8/2013 |
| KR | 10-2014-0055025 A | 5/2014 |
| KR | 10-1645571 B1 | 8/2016 |
| KR | 10-2017-0073949 A | 6/2017 |
| WO | 2017/004663 A1 | 1/2017 |

\* cited by examiner

【FIG. 1】
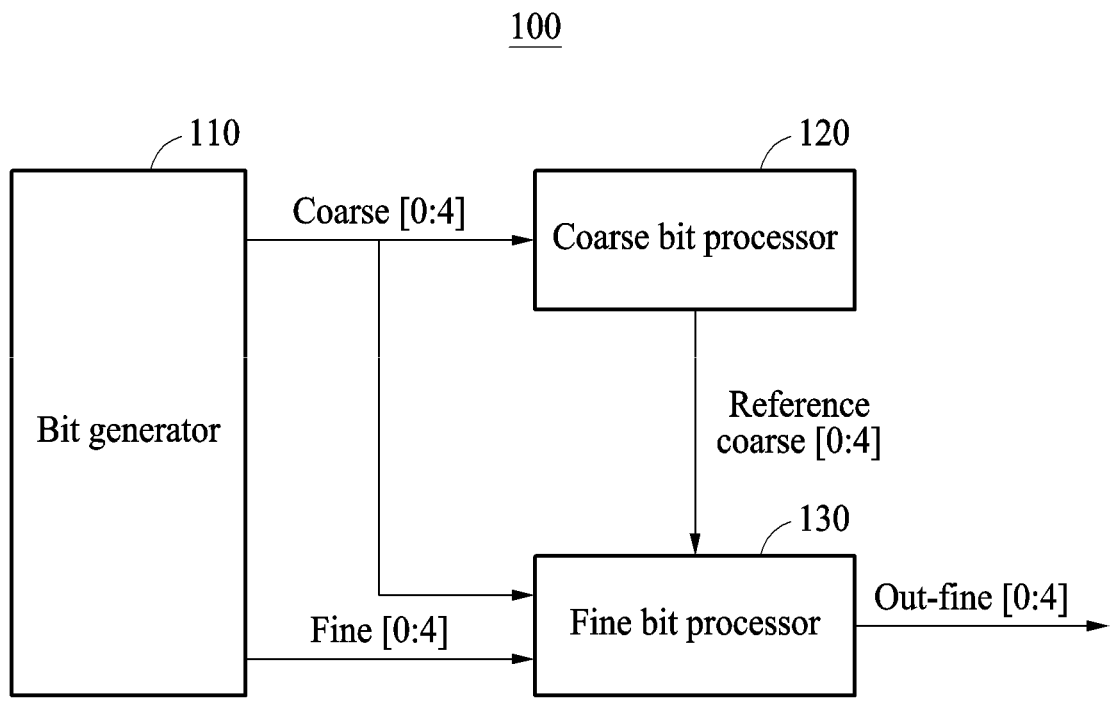
【FIG. 2A】
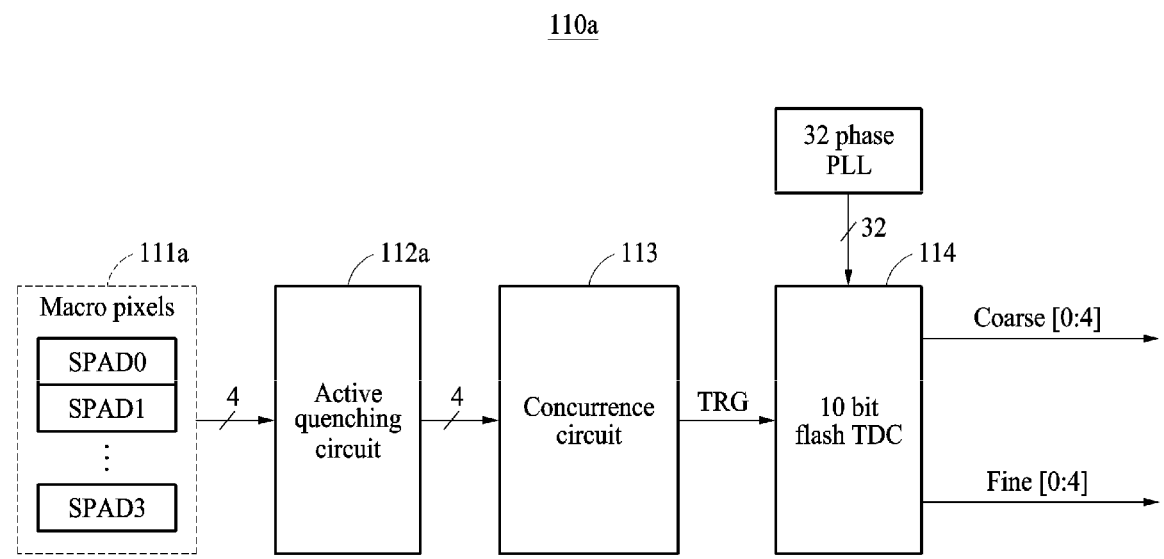

【FIG. 2B】
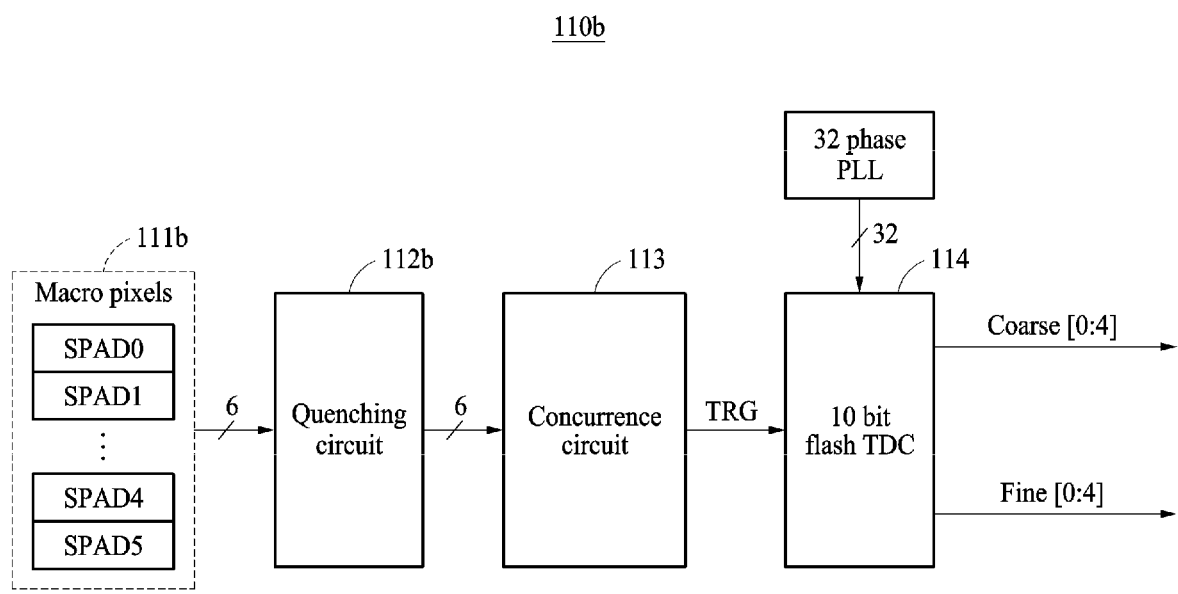

【FIG. 3】
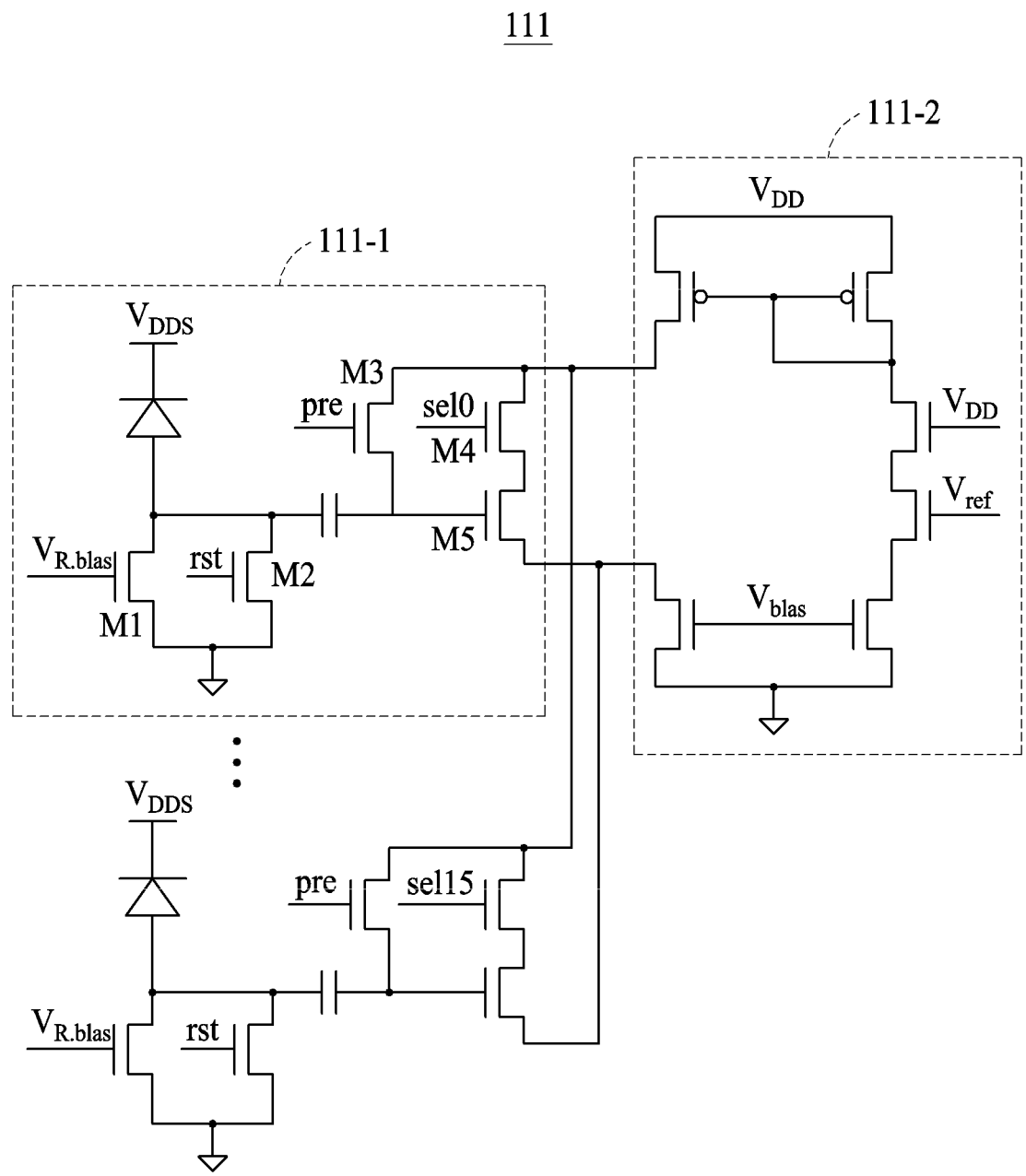

【FIG. 4】
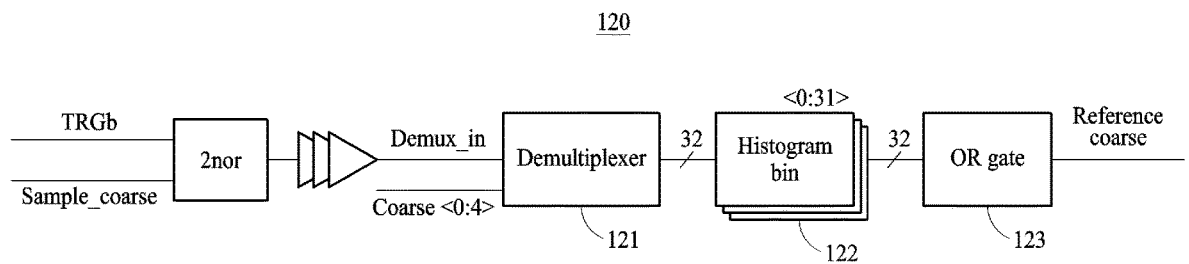
【FIG. 5】
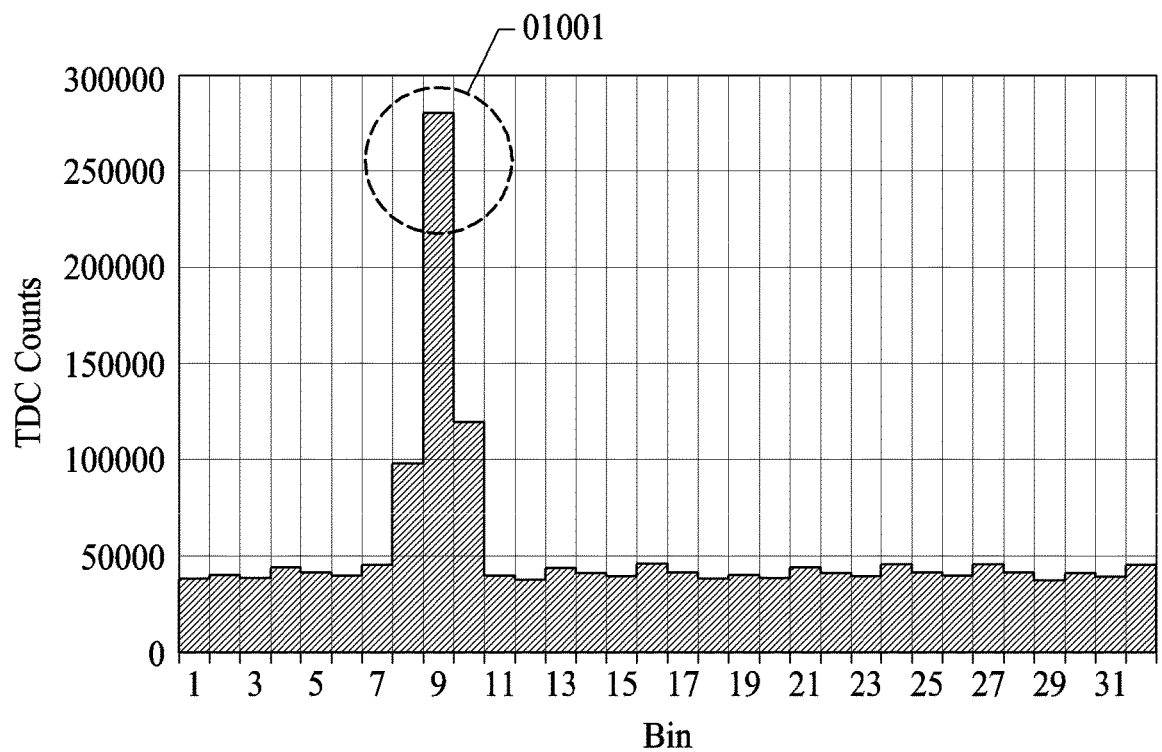

【FIG. 6A】
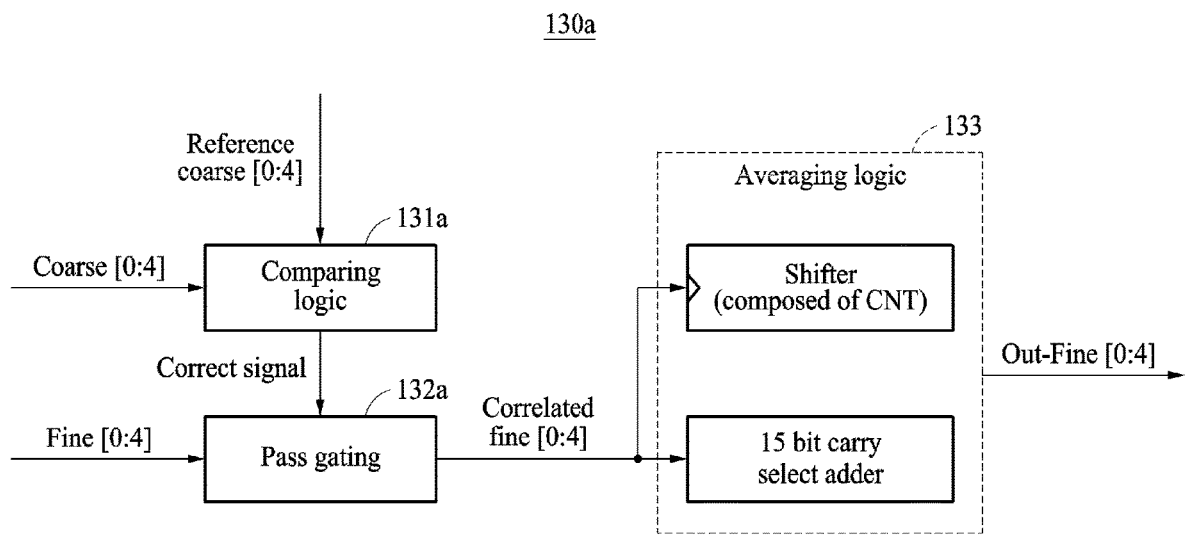
【FIG. 6B】
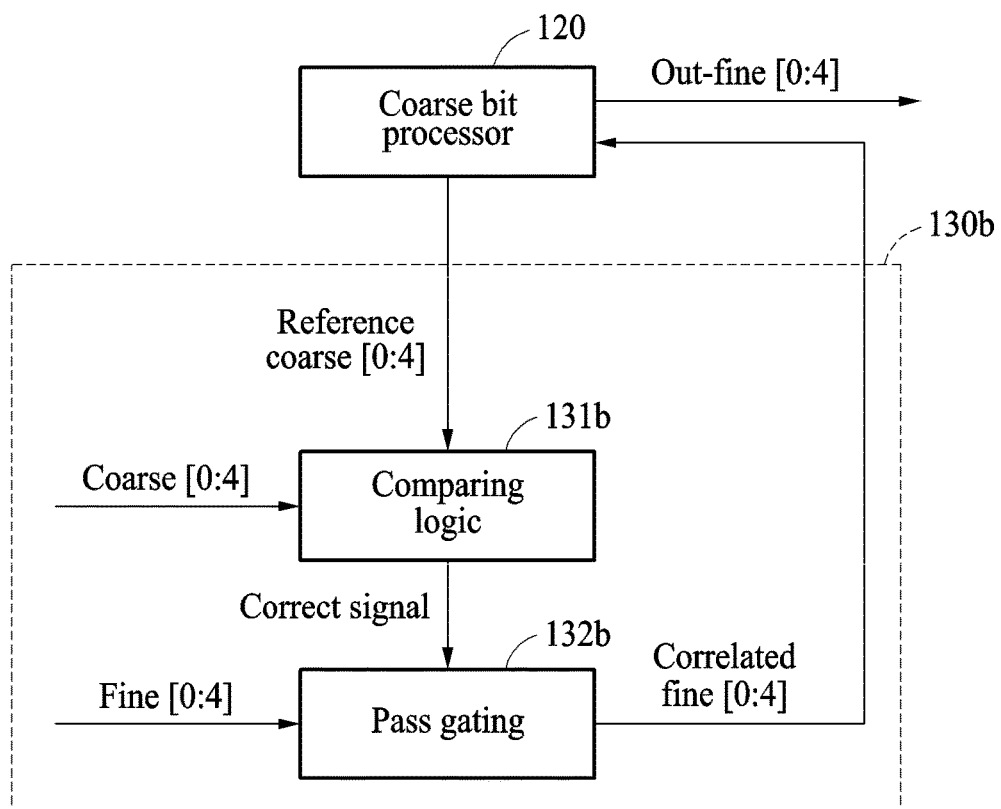

【FIG. 7】
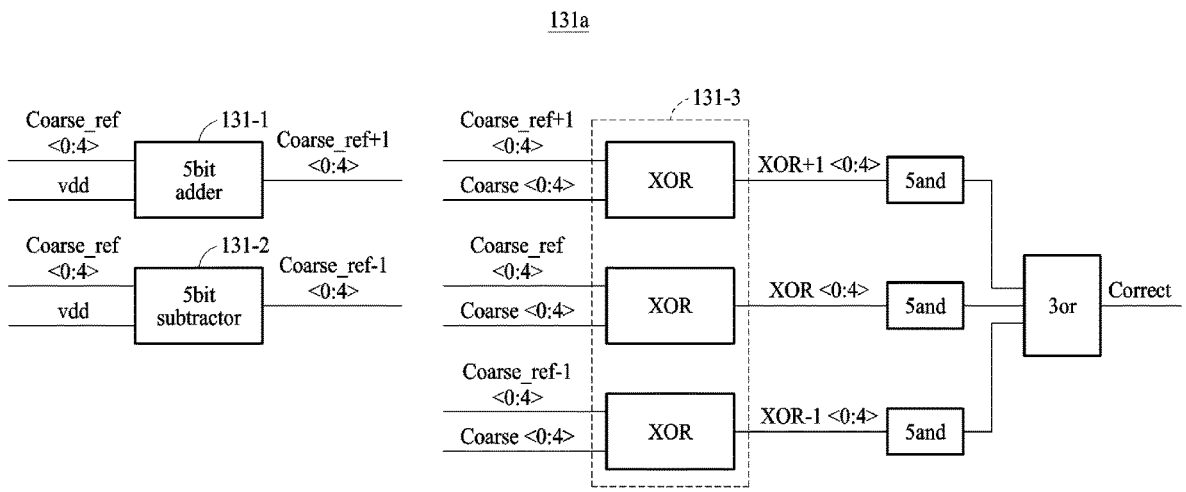
【FIG. 8】
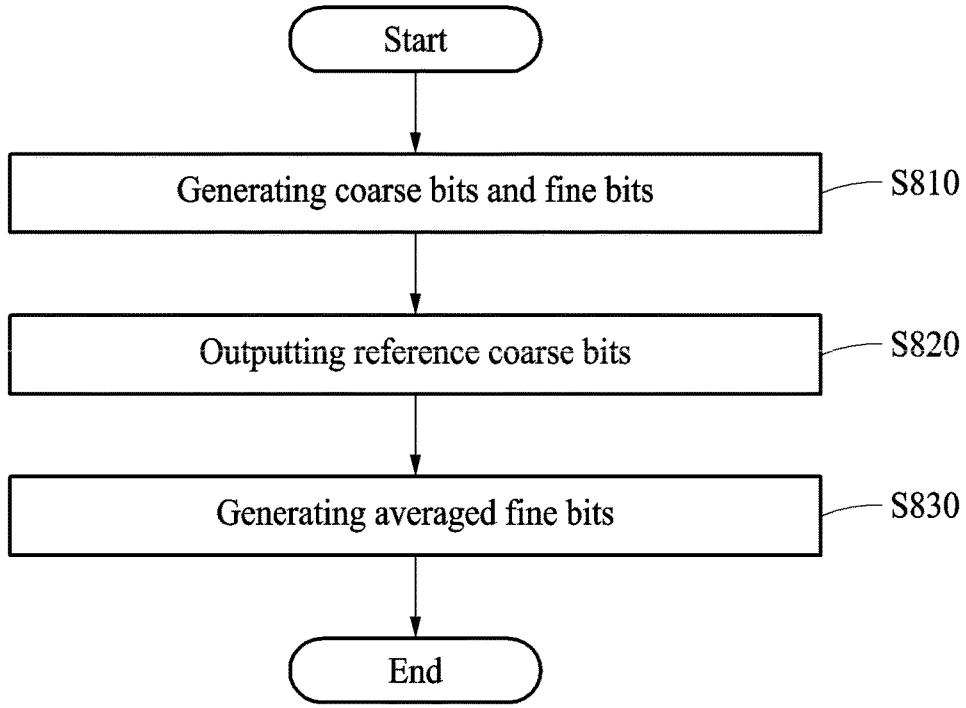

APPARATUS FOR MEASURING DISTANCE USING TWO-STEP TRACKING BASED ON SPAD SENSOR AND METHOD THEREOF

CROSS-REFERENCE TO RELATED APPLICATION

This application claims the priority benefit of Korean Patent Application No. 10-2017-0101161, filed on Aug. 9, 2017 in the Korean Intellectual Property Office, the disclosure of which is incorporated herein by reference.

BACKGROUND OF THE DISCLOSURE

Field of the Disclosure

The present disclosure relates to an apparatus for measuring distance based on a single-photon avalanche diode (SPAD) sensor and a method thereof, and more particularly, to an apparatus for measuring distance using two-step tracking based on a SPAD sensor and a method thereof.

Description of the Related Art

One macro pixel is constituted of 12 or 24 SPADs and an array is constituted of a plurality of macro pixels in conventional distance measuring apparatuses, which cause increase of an area and design complexity.

In addition, a conventional distance measuring apparatus stores distance (time) data, which is output based on a SPAD included in a macro pixel, in a histogram bin and outputs any one histogram bin, a value stored in the bin exceeding a preset threshold, as a final distance measurement value.

However, the aforementioned distance measuring apparatus requires a large memory because the size of the histogram increases according to the number of pixels and a full scale range.

RELATED ART DOCUMENTS

Patent Documents

Japanese Patent Application Publication No. 2014-081253, entitled "LIGHT-SENSITIVE DETECTOR"

Japanese Patent Application Publication No. 2015-055821, entitled "OPTICAL DISTANCE MEASUREMENT DEVICE"

Japanese Patent Application Publication No. 2015-169501, entitled "OPTICAL SENSOR"

SUMMARY OF THE DISCLOSURE

Therefore, the present invention has been made in view of the above problems, and it is one object of the present invention to provide an apparatus for measuring a distance through first tracking using coarse bits and second tracking using fine bits for measuring precise distance to a target corresponding to the coarse bits, and a method thereof.

It is another object of the present invention to provide an apparatus for measuring a distance characterized by performing two-step tracking, which uses coarse bits and fine bits, to reduce the capacity and area of memory, and a method thereof.

It is yet another object of the present invention to provide an apparatus for and a method of measuring a distance characterized in that a plurality of single pixels, each of which is provided with one SPAD and five transistors, externally share a comparator, thereby increasing a fill factor and further reducing a used area.

In accordance with an aspect of the present invention, the above and other objects can be accomplished by the provision of an apparatus for measuring distance including a bit generator configured to generate coarse bits for first tracking from sensing data to measure distance to a target and fine bits for second tracking, corresponding to the coarse bits, to measure precise distance to the target; a coarse bit processor configured to receive the coarse bits, address the received coarse bits in any one histogram bin, which corresponds to the received coarse bits, among a plurality of histogram bins, and output coarse bits, which correspond to any one histogram bin exceeding a preset threshold among the histogram bins, as reference coarse bits; and a fine bit processor configured to output fine bits corresponding to the reference coarse bits.

According to an aspect, the bit generator may generate the coarse bits and fine bits each time the bit generator receives a trigger signal, which is output, as the sensing data when events are detected at the same time from two or more SPAD sensors among a plurality of SPAD sensors included in a macro pixel.

According to an aspect, the bit generator may include the macro pixel constituted of a plurality of single pixels; and a comparator shared by single pixels located in the same row among the single pixels.

According to an aspect, the bit generator may include one SPAD sensor and single pixels constituted of five transistors for supporting active quenching.

According to an aspect, the five transistors may be constituted of NMOS transistors and may include a transistor configured to select one single pixel from single pixels, which share a column, through row selection; and a transistor connected to input of the comparator.

According to an aspect, the coarse bit processor may include a demultiplexer to configured to address the received coarse bit in any one histogram bin, which corresponds to the received coarse bits, among the plurality histogram bins; and an OR gate configured to output coarse bits, which correspond to any one histogram bin exceeding a preset threshold among the histogram bins, as reference coarse bits.

According to an aspect, the fine bit processor may include a comparing logic configured to receive the reference coarse bits from the coarse bit processor, generate reference coarse bits of +1 bit, increased by 1 bit with respect to the received reference coarse bits, and reference coarse bits of −1 bit, decreased by 1 bit with respect to the received reference coarse bits, using an adder and a subtractor, compare the received reference coarse bits and the generated reference coarse bits with the coarse bits, output from the bit generator, and an XOR gate, and, when the coarse bits match, output a correct signal; a pass gating logic configured to, upon receiving the correct signal, receive fine bits corresponding to the received reference coarse bits and the generated reference coarse bits and output the received fine bits; and an averaging logic configured to receive and average the fine bits and output the averaged fine bits to the outside.

According to an aspect, the fine bit processor may include a comparing logic configured to receive the reference coarse bits from the coarse bit processor, compare the received reference coarse bits with the coarse bits, output from the bit generator, and an XOR gate, and, when the coarse bits match, output a correct signal; and a pass gating logic configured to, upon receiving the correct signal, receive fine bits corresponding to the received reference coarse bits and output the received fine bits to the coarse bit processor.

According to an aspect, the coarse bit processor may be configured to, upon receiving the fine bits from the pass gating logic, reset the histogram bins, address the received fine bit in any one histogram bin corresponding to the received fine bits, and output fine bits corresponding to any one histogram bin, which exceeds a preset threshold, among the histogram bins to the outside.

In accordance with another aspect of the present invention, there is provided a method of measuring distance, the method including a step of generating coarse bits for first tracking from sensing data to measure distance to a target; and fine bits for second tracking, corresponding to the coarse bits, to measure precise distance to the target; a step of receiving the coarse bit, addressing the received coarse bit in any one histogram bin, which corresponds to the output coarse bits, among a plurality of histogram bins, and outputting coarse bits, which correspond to any one histogram bin exceeding a preset threshold among the histogram bins, as reference coarse bits; and a step of outputting fine bits corresponding to the reference coarse bits.

According to an aspect, in the step of the generating, the coarse bits and fine bits may be generated each time trigger signals, which are output, are received as the sensing data when events are detected at the same time from two or more SPAD sensors among a plurality of SPAD sensors included in a macro pixel.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 illustrates a block diagram of an apparatus for measuring distance of the present disclosure;

FIG. 2A illustrates a first example of a bit generator included in an apparatus for measuring distance;

FIG. 2B illustrates a second example of a bit generator included in an apparatus for measuring distance;

FIG. 3 illustrates a macro pixel provided in a bit generator;

FIG. 4 illustrates a coarse bit processor included in an apparatus for measuring distance;

FIG. 5 illustrates a histogram generated by first tracking using coarse bits in a coarse bit processor;

FIG. 6A illustrates a first example of a fine bit processor included in an apparatus for measuring distance;

FIG. 6B illustrates a second example of a fine bit processor included in an apparatus for measuring distance;

FIG. 7 illustrates a comparing logic included in a fine bit processor; and

FIG. 8 is a flowchart illustrating a method of measuring distance according to the present disclosure.

DETAILED DESCRIPTION OF THE DISCLOSURE

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users.

Accordingly, definitions of the terms should be in the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "an apparatus configured to . . . " may refer to an apparatus configured to operate "with another apparatus or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

FIG. 1 illustrates a block diagram of an apparatus for measuring distance of the present disclosure.

Referring to FIG. 1, an apparatus 100 for measuring distance of the present disclosure serves to generate coarse bits for first tracking from sensing data to measure distance to a target (not shown) and fine bits for second tracking to measure precise distance to the target, output a coarse bits, which correspond to any one histogram bin exceeding a preset threshold among a plurality of histogram bins in which the coarse bits are stored, as reference coarse bits, and output fine bits corresponding to the reference coarse bits.

To accomplish this, the apparatus 100 for measuring distance according to an embodiment of the present disclosure includes a bit generator 110, a coarse bit processor 120, and a fine bit processor 130.

The bit generator 110 generates coarse bits for first tracking from sensing data to measure distance to a target and generates fine bits for second tracking, corresponding to the coarse bits, to measure precise distance to the target.

According to an embodiment, the bit generator 110 may receive trigger signals generated when events are detected at the same time from two or more SPAD sensors among a plurality of SPAD sensors included in a macro pixel, and may generate coarse bits and fine bits each time it receives the trigger signals.

Hereinafter, the configuration and operation steps of the bit generator 110 (110a, 110b) are described in detail with reference to FIGS. 2A to 2B.

FIG. 2A illustrates a first example of a bit generator included in an apparatus for measuring distance.

A bit generator 110a according to a first example may include macro pixels 111a, an active quenching circuit 112a, a concurrence circuit 113, and a time-to-digital converter (TDC) 114.

FIG. 2B illustrates a second example of a bit generator included in an apparatus for measuring distance.

A bit generator 110b according to a second example may include macro pixels 111b, a quenching circuit 112b, a concurrence circuit 113, and a TDC 114.

The bit generator 110 shown in FIG. 1 may be the bit generator 110a according to the first example or the bit generator 110b according to the second example.

FIG. 3 illustrates a macro pixel provided in a bit generator.

The macro pixels 111a of FIG. 3 may be provided in the bit generator 110a according to the first example and may include a plurality of single pixels 111-1 and a comparator 111-2 externally shared by the single pixels 111-1.

First Example of Bit Generator

Referring to FIGS. 2A and 3, the bit generator 110a according to the first example may include macro pixels 111a, which are constituted of a plurality of single pixels 111-1, and a comparator 111-2 shared by single pixels 111-1 located in the same row among the single pixels 111-1.

For example, one macro pixel constituting the macro pixels 111a may be constituted of four single pixels 111-1.

In addition, the comparator 111-2 may be externally shared by the single pixels 111-1 located in the same row.

According to an embodiment, each of the single pixels 111-1 provided in the bit generator 110 may be constituted of one SPAD sensor and five transistors M1 to M5 for supporting active quenching.

The five transistors M1 to M5 may be constituted of NMOS transistors, and may include a transistor configured to select a single pixel from a plurality of single pixels, which share a column, through row selection; and a transistor connected to the input of the comparator 111-2.

More particularly, the single pixels 111-1 may include one SPAD sensor, a first transistor M1 having improved resistance controllability compared to a conventional poly resistant, a second transistor M1 performing a reset function, a third transistor M3 performing DC coupling and setting a DC value to a reference voltage of a comparator, a fourth transistor M4 selecting one single pixel from a plurality of single pixels, which share a column, through row selection, and a fifth transistor M5 connected to input of the comparator 111-2.

Here, an output value of the comparator 111-2 may be shared outside the single pixels 111-1, whereby a fill factor may be improved.

The active quenching circuit 112a may include the first to fifth transistors M1 to M5, which are included in the macro pixels 111a, configured to support active quenching; a control signal generation logic (not shown) configured to generate a control signal applied to the comparator 111-2 and the first to fifth transistors M1 to M5; and the like.

The concurrence circuit 113 may generate a trigger signal (TRG) when events are detected at the same time from two or more SPAD sensors among a plurality of SPAD sensors included in one macro pixel constituting the macro pixels 111a.

For example, the events detected from the SPAD sensors may be events wherein a photon is output by a laser reflected from a target object in the SPAD sensors.

The TDC 114 may generate coarse bits and fine bits each time the concurrence circuit 113 receives a TRG as the sensing data.

For example, the TDC 114 may generate 5 coarse bits and 5 fine bits, which correspond to the 5 coarse bits, each time the concurrence circuit 113 receives a TRG.

For example, the TDC 114 may generate coarse bits '00000' when time (distance) data derived by a received TRG is within a range of 0 to 3.3 ns, may generate coarse bits '00001' when it is within a range of 3.3 to 6.6 ns, may generate coarse bits '00002' when it is within a range of 6.6 to 9.9 ns, and may generate coarse bits '11111' when it is within a range of 102.3 to 105.6 ns.

For example, the TDC 114 may generate fine bits with an interval of 103 ps by dividing 3.3 to 6.6 ns into 32 bits when time (distance) data derived by a received TRG is within a range of 3.3 to 6.6 ns and thus coarse bits '00001' is generated.

For example, the TDC 114 may output coarse bits '01001' and fine bits '00001' when time (distance) data derived by a received TRG is 29.7 ns+103 ps.

Second Example of Bit Generator

Referring to FIG. 2B, one macro pixel constituting the macro pixels 111b of the bit generator 110b according to the second example may include six SPAD sensors.

According to an embodiment, the quenching circuit 112b may be a circuit configured to support passive quenching.

The bit generator 110b, the concurrence circuit 113, and the TDC 114 according to the second example are the same as the bit generator 110a, the concurrence circuit 113, and the TDC 114 according to the first example described above. Accordingly, particular description thereof is omitted.

Referring to FIG. 1 again, the coarse bit processor 120 receives coarse bits from the bit generator 110 and addresses the received coarse bits in any one histogram bin, which corresponds to the received coarse bits, among a plurality of histogram bins.

Here, the coarse bit processor 120 outputs coarse bits corresponding to any one histogram bin, which exceeds a preset threshold, among a plurality of histogram bins as reference coarse bits.

For example, the coarse bit processor 120 may output coarse bits corresponding to a histogram bin with a peak value among a plurality of histogram bins, in which a plurality of coarse bits generated through repetition for a predetermined period in the bit generator 110 to have a preset threshold are addressed, as reference coarse bits.

Hereinafter, the configuration and operation steps of the coarse bit processor 120 are described in detail with reference to FIGS. 4 to 5.

FIG. 4 illustrates a coarse bit processor included in an apparatus for measuring distance.

A coarse bit processor 120 of FIG. 4 may include a demultiplexer 121, up counter (UCNT)-based histogram bins 122, and an OR gate 123.

FIG. 5 illustrates a histogram generated by first tracking using coarse bits in a coarse bit processor.

In the histogram of FIG. 5, the X-axis denotes a histogram bin corresponding to time (distance) data, and the Y-axis denotes an accumulated value of coarse bits addressed in each histogram bin.

Referring to FIGS. 4 to 5, the demultiplexer 121 of the coarse bit processor 120 may address coarse bits received from the bit generator 110 in any one histogram bin, which corresponds to the coarse bits, among the histogram bins 122.

For example, the demultiplexer 121, upon receiving coarse bits '00000' from the bit generator 110, may address the received coarse bits '00000' in histogram bin No. 1.

The demultiplexer 121, upon receiving coarse bits '00001', may address the received coarse bits '00001' in histogram bin No. 2.

In the same manner, the demultiplexer 121, upon receiving coarse bits '00002,' may address the received coarse bits '00002' in histogram bin No. 3, and, upon receiving coarse bits '11111,' may address the received coarse bits '11111' in histogram bin No. 32.

For example, the histogram bins 122 may be constituted of 32 UCNTs and may only output most significant bits (MSB) corresponding to 32 histogram bins.

According to an embodiment, an OR gate 123 may output coarse bits corresponding to any one histogram bin, which exceeds a preset threshold, among the histogram bins 122 as reference coarse bits.

For example, the OR gate 123 may, when any one histogram bin among the histogram bins 122 completes counting to a specified target number, output coarse bits corresponding to the histogram bin as reference coarse bits.

For example, the OR gate 123 may, when histogram bin No. 10 completes counting to a specified target number and thus has a peak value, output coarse bits '01001' corresponding to the histogram bin No. 10 as reference coarse bits.

Referring to FIG. 1 again, the fine bit processor 130 outputs fine bits corresponding to reference coarse bits that are output from the coarse bit processor 120.

Hereinafter, the configuration and operation steps of the fine bit processor 130 (130a, 130b) are described in detail with reference to FIGS. 6A to 7.

FIG. 6A illustrates a first example of a fine bit processor included in an apparatus for measuring distance.

A fine bit processor 130a according to the first example may include a comparing logic 131a, a pass gating logic 132a, and an averaging logic 133.

FIG. 6B illustrates a second example of a fine bit processor included in an apparatus for measuring distance.

A fine bit processor 130b according to the second example may include a comparing logic 131b and a pass gating logic 132b.

The fine bit processor 130 shown in FIG. 1 may be the fine bit processor 130a according to the first example or the fine bit processor 130b according to the second example.

FIG. 7 illustrates a comparing logic included in a fine bit processor.

A comparing logic 131a of FIG. 7 may be the comparing logic 131a included in the fine bit processor 130a according to the first example and may include a 5 bit adder 131-1, a 5 bit subtractor 131-2, and an exclusive OR (XOR) gate 131-3.

First Example of Fine Bit Processor

Referring to FIGS. 6A and 7, the comparing logic 131a of the fine bit processor 130a according to the first example may receive reference coarse bits from the coarse bit processor 120 and may generate reference coarse bits of +1 bit increased by 1 bit with respect to the received reference coarse bits and reference coarse bits of −1 bit decreased by 1 bit with respect to the received reference coarse bits using the adder 131-1 and the subtractor 131-2.

The comparing logic 131a may compare the received reference coarse bits and the generated reference coarse bits with coarse bits output from the bit generator 110 and the XOR gate 131-3 and, when the coarse bits match, may output a correct signal.

For example, the comparing logic 131a may, upon receiving reference coarse bits, '01001,' from the coarse bit processor 120, generate reference coarse bits of +1 bit, '01010,' using the adder 131-1 and may generate reference coarse bits of −1 bit, '01000,' using the subtractor 131-2.

The comparing logic 131 may compare the received reference coarse bits, '01001,' and the generated reference coarse bits, '01010' and '01000,' with coarse bits output from the bit generator 110 and the XOR gate 131-3 and, when the reference coarse bits match the coarse bits output from the bit generator 110, may output a correct signal.

According to an embodiment, the pass gating logic 132a may, upon receiving a correct signal from the comparing logic 131a, receive and output fine bits corresponding to the received reference coarse bits and the generated reference coarse bits.

For example, the pass gating logic 132a may, upon receiving the correct signal from the comparing logic 131a, the received reference coarse bits are '01001,' and the generated reference coarse bits are '01010' and '01000,' receive and output fine bits corresponding to the coarse bits '01000', '01001' and '01010.'

For example, the pass gating logic 132a may, when the correct signal is received from the comparing logic 131a, the received reference coarse bits are '01001,' and the generated reference coarse bits are '01010' and '01000,' receive and output all time data including coarse bits and fine bits corresponding to the coarse bits '01000', '01001' and '01010.'

According to an embodiment, the averaging logic 133 may receive and average the fine bits output from the pass gating logic 132a and may output the averaged fine bits to the outside.

For example, the averaging logic 133 may receive and average the fine bits corresponding to the received reference coarse bits and the generated reference coarse bits.

For example, the averaging logic 133 may receive and average all time data including the coarse bits and the fine bits corresponding to the received reference coarse bits and the generated reference coarse bits.

That is, the fine bit processor 130a according to the first example may receive the fine bits corresponding to the received reference coarse bits and the generated reference coarse bits and perform second tracking serving to output averaged fine bits, thereby reducing the capacity and area of memory compared to conventional cases.

Second Example of Fine Bit Processor

Referring to FIG. 6B, the comparing logic 131b of the fine bit processor 130b according to the second example may receive reference coarse bits from the coarse bit processor 120, compare the received reference coarse bits with coarse bits output from the bit generator 110 and an XOR gate, and when the coarse bits match, output a correct signal.

According to an embodiment, the pass gating logic 132b, upon receiving a correct signal, may receive fine bits corresponding to the received reference coarse bits and may output the received fine bits to the coarse bit processor 120.

For example, the pass gating logic 132b may output all fine bits corresponding to the received reference coarse bits, without averaging the same, to the coarse bit processor 120.

For example, the pass gating logic 132b may receive the correct signal from the comparing logic 131b, may receive, when the received reference coarse bits are '01001,' fine bits corresponding to the coarse bits '01001,' and may output the received fine bits to the coarse bit processor 120.

According to an embodiment, the coarse bit processor 120, upon receiving the fine bits from the pass gating logic 132b, may reset a plurality of histogram bins, may address the received fine bits in any one histogram bin corresponding to the received fine bits, and may output fine bits corresponding to any one histogram bin exceeding a preset threshold among the histogram bins to the outside.

That is, the fine bit processor 130b according to the second example performs second tracking, which uses fine bits corresponding to reference coarse bits, while sharing histogram bins provided in the coarse bit processor 120, thereby further reducing the capacity and area of memory compared to conventional distance measuring apparatuses and distance measuring apparatus including the fine bit processor according to the first example.

Preferably, fine bits output from the coarse bit processor 120 to the outside may be received and processed by a processing device (not shown) provided outside, thereby obtaining a highly accurate distance measurement value.

FIG. 8 is a flowchart illustrating a method of measuring distance according to the present disclosure.

The method of measuring distance shown in FIG. 8 may be performed using the apparatus 100 for measuring distance shown in FIG. 1.

Referring to FIG. 8, in S810, the apparatus 100 generates coarse bits for first tracking from sensing data to measure distance to a target and fine bits for second tracking, corresponding to the coarse bits, to measure precise distance to the target.

According to an embodiment, in S810 of generating coarse bits and fine bits, the apparatus 100 may generate the coarse bits and fine bits, each time it receives trigger signals that are output, when events are detected from two or more SPAD sensors among a plurality of SPAD sensors included in a macro pixel.

In S820, the apparatus 100 receives coarse bits, addresses the received coarse bits in any one histogram bin, which corresponds to the coarse bits, among a plurality of histogram bins, which is output, and outputs coarse bits, which corresponds to any one histogram bin exceeding a preset threshold among the histogram bins, as reference coarse bits.

In S830, the apparatus 100 outputs fine bits corresponding to the reference coarse bits.

In accordance with the present disclosure, distance may be measured by first tracking using coarse bits and second tracking using fine bits for measuring precise distance to a target corresponding to the coarse bits.

In accordance with the present disclosure, the capacity and area of memory may be reduced by performing two-step tracking that uses coarse bits and fine bits.

In addition, a plurality of single pixels, each of which is provided with one SPAD and five transistors, externally share a comparator, thereby increasing a fill factor and further reducing a used area.

The aforementioned apparatus may be realized by hardware component, a software component, and/or a combination of hardware and software components. For example, the apparatus and components described in the embodiments may be realized using one or more general-purpose computers or special-purpose computers such as, for example, a processor, a controller, an arithmetic logic unit (ALU), a digital signal processor, a microcomputer, a field programmable array (FPA), a programmable logic unit (PLU), a microprocessor, or other devices implementing instructions and responding thereto. The processor may execute one or software applications that run on an operating system (OS). In addition, the processor may approach data, store, manipulate, and process the data, and generate new data by responding to running of software. Although one processor has been used to aid in understanding, those skilled in the art can understand that the processor may include a plurality of processing elements and/or a plurality of processing element types. For example, the processor may include a plurality of processors or a combination of one processor and controller. Further, another processing configuration, such as a parallel processor, may be applied.

Software may include a computer program, code, instructions, or a combination of one or more of the foregoing, and may configure a processing device to operate as desired or independently or collectively a command to a processing device. Software and/or data may be permanently or temporarily embodied in the form of any type of machines, components, physical devices, virtual equipment, computer storage media or devices, or a signal wave to be transmitted, so as to be interpreted by a processing device or to provide a command or date to a processing device.

Software may be distributed over a networked computer system, and stored or executed in a distributed manner. Software and data may be stored on one or more computer readable media.

Embodiments of the present disclosure can include a computer readable medium including program commands for executing operations implemented through various computers. The computer readable medium can store program commands, data files, data structures or combinations thereof. The program commands recorded in the medium may be specially designed and configured for the present disclosure or be known to those skilled in the field of computer software. Examples of a computer readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices may be configured to operate as one or more software modules to perform operations in the embodiments, and vice versa.

DESCRIPTION OF SYMBOLS

100: Apparatus for measuring distance
110: Bit generator
111: Macro pixels
111-1: Single pixel
111-2: Comparator
112: Active quenching circuit
113: Concurrence circuit
114: Time to digital converter (TDC)
120: Coarse bit processor
121: Demultiplexer
122: Histogram bin
123: OR gate
130: Fine bit processor
131: Comparing logic
131-1: Adder
131-2: Subtractor
131-3: Exclusive-OR gate (XOR)
132: Pass gating logic
133: Averaging logic

What is claimed is:

1. An apparatus for measuring distance, comprising:
a bit generator configured to generate coarse bits for first tracking from sensing data to measure distance to a target and fine bits for second tracking, corresponding to the coarse bits, to measure precise distance to the target;
a coarse bit processor configured to receive the coarse bits, address the received coarse bits in any one histogram bin, which corresponds to the received coarse bits, among a plurality of histogram bins, and output coarse bits, which correspond to any one histogram bin exceeding a preset threshold among the histogram bins, as reference coarse bits; and
a fine bit processor configured to output fine bits corresponding to the reference coarse bits.

2. The apparatus according to claim 1, wherein the bit generator generates the coarse bits and fine bits each time the bit generator receives a trigger signal, which is output, as the sensing data when events are detected at the same time from two or more SPAD sensors among a plurality of SPAD sensors comprised in a macro pixel.

3. The apparatus according to claim 2, wherein the bit generator comprises the macro pixel constituted of a plurality of single pixels; and a comparator shared by single pixels located in the same row among the single pixels.

4. The apparatus according to claim 3, wherein the bit generator comprises one SPAD sensor and single pixels constituted of five transistors for supporting active quenching.

5. The apparatus according to claim 4, wherein the five transistors is constituted of NMOS transistors and comprise a transistor configured to select one single pixel from single pixels, which share a column, through row selection; and a transistor connected to input of the comparator.

6. The apparatus according to claim 1, wherein the coarse bit processor comprises a demultiplexer to configured to address the received coarse bit in any one histogram bin, which corresponds to the received coarse bits, among the plurality histogram bins; and
an OR gate configured to output coarse bits, which correspond to any one histogram bin exceeding a preset threshold among the histogram bins, as reference coarse bits.

7. The apparatus according to claim 1, wherein the fine bit processor comprises a comparing logic configured to receive the reference coarse bits from the coarse bit processor, generate reference coarse bits of +1 bit, increased by 1 bit with respect to the received reference coarse bits, and reference coarse bits of −1 bit, decreased by 1 bit with respect to the received reference coarse bits, using an adder and a subtractor, compare the received reference coarse bits and the generated reference coarse bits with the coarse bits, output from the bit generator, and an XOR gate, and, when the coarse bits match, output a correct signal;
a pass gating logic configured to, upon receiving the correct signal, receive fine bits corresponding to the received reference coarse bits and the generated reference coarse bits and output the received fine bits; and
an averaging logic configured to receive and average the fine bits and output the averaged fine bits to the outside.

8. The apparatus according to claim 1, wherein the fine bit processor comprises a comparing logic configured to receive the reference coarse bits from the coarse bit processor, compare the received reference coarse bits with the coarse bits, output from the bit generator, and an XOR gate, and, when the coarse bits match, output a correct signal; and
a pass gating logic configured to, upon receiving the correct signal, receive fine bits corresponding to the received reference coarse bits and output the received fine bits to the coarse bit processor.

9. The apparatus according to claim 8, wherein the coarse bit processor is configured to, upon receiving the fine bits from the pass gating logic, reset the histogram bins, address the received fine bit in any one histogram bin corresponding to the received fine bits, and output fine bits corresponding to any one histogram bin, which exceeds a preset threshold, among the histogram bins to the outside.

10. A method of measuring distance, the method comprising:
generating coarse bits for first tracking from sensing data to measure distance to a target; and fine bits for second tracking, corresponding to the coarse bits, to measure precise distance to the target;
receiving the coarse bit, addressing the received coarse bit in any one histogram bin, which corresponds to the output coarse bits, among a plurality of histogram bins, and outputting coarse bits, which correspond to any one histogram bin exceeding a preset threshold among the histogram bins, as reference coarse bits; and
outputting fine bits corresponding to the reference coarse bits.

11. The method according to claim 10, wherein, in the generating, the coarse bits and fine bits are generated each time trigger signals, which are output, are received as the sensing data when events are detected at the same time from two or more SPAD sensors among a plurality of SPAD sensors comprised in a macro pixel.

* * * * *